United States Patent [19]

Textor et al.

[11] Patent Number: 5,403,657
[45] Date of Patent: Apr. 4, 1995

[54] ALUMINUM SURFACES

[75] Inventors: Marcus Textor, Schaffhausen; Roman Fuchs, Neuhausen both of Switzerland; Volkmar Gillich, Jestetten; Erich Simon, Singen, both of Germany

[73] Assignee: Alusuisse-Lonza Services Ltd., Zurich, Switzerland

[21] Appl. No.: 44,451

[22] Filed: Apr. 9, 1993

Related U.S. Application Data

[63] Continuation of Ser. No. 812,750, Dec. 23, 1991, abandoned.

[30] Foreign Application Priority Data

Jan. 11, 1991 [CH] Switzerland .................. 0068/91

[51] Int. Cl.$^6$ ............................... G02B 5/08
[52] U.S. Cl. ...................... 428/336; 428/216; 428/469; 428/472; 428/697; 428/699; 428/701; 428/702
[58] Field of Search ............ 428/472, 469, 216, 697, 428/699, 701, 702, 336

[56] References Cited

U.S. PATENT DOCUMENTS

| | | | |
|---|---|---|---|
| 3,372,008 | 3/1968 | Korver | 428/687 |
| 4,556,285 | 12/1985 | Sugiura et al. | 350/600 |
| 4,691,998 | 9/1987 | Sakagaito et al. | 350/616 |
| 4,826,737 | 5/1989 | Yamada et al. | 148/11.5 A |

FOREIGN PATENT DOCUMENTS 256197 11/1963 Australia .
60-247602 12/1985 Japan .

Primary Examiner—A. A. Turner
Attorney, Agent, or Firm—Bachman & LaPointe

[57] ABSTRACT

Articles of aluminum containing at least one unanodized surface or parts of at least one unanodized surface which are suitable for the deposition of layers or layer systems from the gas phase on said unanodized surfaces, the unanodized surfaces being of a refined aluminum with a degree of purity of equal to, or greater than, 98.3% by weight or aluminum alloys of said aluminum with at least one of the elements from the series comprising Si, Mg, Mn, Cu, Zn or Fe, and the surfaces have a peak-to-valley height Ra of equal to, or less than, 1 μm, and the layer or the layer system is a reflective layer, in particular for radiations in the optical range.

11 Claims, No Drawings

ALUMINUM SURFACES

This is a continuation of application Ser. No. 812,750, filed Dec. 23, 1991, now abandoned.

BACKGROUND OF THE INVENTION

The present invention relates to articles of aluminum containing at least one surface or parts of at least one surface which are suitable for the deposition of layers or layer systems from the gas phase on said surfaces, and their use.

It is known to manufacture strips in bright materials, for example refined aluminum or AlMg alloys based on aluminum having a degree of purity of 99.8 and higher, such as, for example, 99.9%, and rolled surfaces which produce diffuse or directed light reflection depending on application. It is also known to polish the surfaces of such strips chemically or electrolytically to increase the total reflection or directed reflection and then to produce a protective layer of, for example, 1–5 μm layer thickness by anodic oxidation.

These known processes have the disadvantage that expensive bright alloys based on refined aluminum have to be used. As a result of the anodic oxide layer, the reflectivity of the surface, and in that connection both the total reflection and also the directed reflection, decreases due to absorption and light scattering, in particular in the oxide layer. This signifies an energy loss.

Chemical treatment, and in that connection the production of the degree of brightness in particular, is not without problems from the point of view of environmental pollution by effluent waters and wastes.

Finally, in the normal thickness range of 1 to 3 μm, the anodic oxide layer often has troublesome interference effects, the so-called iridescence.

The object of the present invention is to avoid said disadvantages and to propose articles of aluminum which contain at least one surface or parts of at least one surface which are suitable for the deposition of layers or layer systems from the gas phase on said surfaces, and said layers or layer systems facilitate as loss-free a reflection of energy as possible.

SUMMARY OF THE INVENTION

According to the invention, this is achieved in that the unanodised surfaces are of a refined aluminum with a degree of purity equal to, or greater than, 98.3% by weight or aluminum alloys of said aluminum with at least one of the elements from the series comprising Si, Mg, Mn, Cu, Zn or Fe, and the surfaces have a peak-to-valley height Ra of equal to, or less than, 1 μm.

Aluminium alloys containing Si are preferred, in particular, for surfaces which are on articles which are manufactured by extruding or pressing.

DETAILED DESCRIPTION

All spatial formed bodies which have at least one free surface may find use as articles of aluminum. Said free surface is, for example, an aluminum with a purity of 98.3% and higher, expediently 99.0% and higher, preferably 99.9% and higher and, in particular, 99.95% and higher. In addition to aluminum of said purities, the surface may also represent an alloy, preferably, for example, aluminum alloys containing 0.25 to 5% by weight, in particular 0.5 to 2% by weight, of magnesium, or containing 0.2 to 2% by weight of manganese, or containing 0.5 to 5% by weight of magnesium and 0.2 to 2% by weight of manganese, in particular, for example, 1% by weight of magnesium and 0.5% by weight of manganese, or containing 0.1 to 12% by weight, preferably 0.1 to 5% by weight, of copper, or containing 0.5 to 5% by weight of zinc and 0.5 to 5% by weight of magnesium, or containing 0.5 to 5% by weight of zinc, 0.5 to 5% by weight of magnesium and 0.5 to 5% by weight of copper, or containing 0.5 to 5% by weight of iron and 0.2 to 2% by weight of manganese, in particular, for example, 1.5% by weight of iron and 0.4% by weight of manganese.

Examples of particularly preferred surfaces are aluminum with a purity of 99.5% and higher, 99.8% and higher, 99.85% and higher, 99.9% and higher and 99.95% and higher, or surfaces of an aluminum alloy containing 0.5% by weight of magnesium or containing 1% by weight of magnesium or containing aluminum of a purity of 99% and 5 to 10 and in particular 7% by weight of magnesium and 6 to 12 and in particular 8% by weight of copper.

Examples of articles of aluminum are rolled products such as foils, strips, panels, sheets; possibly, parts reshaped by bending, deep drawing, cold extrusion and the like, furthermore profiled sections, girders and other shapes of pieces. Depending on application purpose, the entire article may be of the said aluminum or aluminum alloy, but also only subregions or surface regions may consist thereof.

Preferred are rolled surfaces and articles which are manufactured by rolling, i.e. for example foils, strips or sheets containing the surfaces according to the invention. The said aluminum or the aluminum alloy may also represent a part and at least one surface, or only a sub-surface of a composite, for example of a composite foil or laminate, or of another substrate of any desired material such as, for example, of plastic, metal or ceramic.

The surfaces according to the invention may be produced, for example, by rolling or grinding. Preferred are rolled surfaces which can be produced with smooth or structured rollers. The surfaces may be pickled, for example, between individual, a plurality of, or all the rolling operations (passes), this being done in particular to remove the rolling abrasion. The pickling attacks on the surfaces can be carried out in a manner known per se, for example acidically or alkalinely.

If structured rolled surfaces are provided for rolling, the rolled surface can be structured, for example, in a chemical, physical or mechanical way, for example by electron beam erosion, by laser beam erosion, by electrolytic erosion or by sandblasting. These processes are known per se.

The unandized surfaces according to the invention may also be subjected to an electrolytic or electrochemical polishing process. Such polishing processes are known per se and have hitherto been used before the hitherto usual anodizing.

Expediently, the articles according to the invention have a surface peak-to-valley height Ra of 0.1 to 1 μm and preferably of 0.3 to 0.4 μm.

These surface peak-to-valley heights result in articles with, in particular, matt surfaces and, preferably, diffuse or directed scattering reflection.

In another expedient embodiment, the articles have a surface peak-to-valley height Ra equal to, or less than, 0.1 μm, and preferably equal to, or less than, 0.03 μm. Preferred is a surface peak-to-valley height Ra of 0.001 μm to 0.03 μm, and in particular of 0.003 μm to 0.03 μm. Such surface peak-to-valley heights are suitable, in particular, for the formation of articles with highly polished surfaces and directed reflection.

The surface peak-to-valley height Ra is defined in at least one of the DIN Specifications 4761 to 4768.

A layer or a layer system for the reflection of energy in the form of waves and/or particles, expediently radiation with wavelengths in the optical range and, preferably, of visible light, in particular with wavelengths between 400 and 750 nm, can be applied to the surfaces.

A light reflecting layer such as, for example, a layer of Al, Ag, Cu, Au or alloys, for example containing at least one of the said elements, may for example be provided as a layer on the surface.

Examples of layer systems are those which, starting from the surface according to the invention, are built up from:

In some cases an adhesive layer (layer A) such as, for example, a ceramic layer. Such layers may contain, for example, compounds of the formulae $SiO_x$, where x is a number from 1 to 2, or $AlyOz$, where y/z represents a number from 0.2 to 1.5, or consist thereof. Preferred is an adhesive layer containing $SiO_x$, where x has the above meaning.

A light reflecting layer (layer B), for example a metallic layer containing, or consisting of, for example Al, Ag, Au, Cu, or alloys, for example containing at least one of the said elements.

A transparent protective layer (layer C), for example consisting of or containing oxides, nitrides, fluorides, etc. of alkali metals, for example Li, Na, K, alkaline earth metals, for example Mg, Ca, Sr, Ba, and/or transition metals such as, for example, Sc, Ti, V, Cr, Mn, Fe, Co, Ni, Y, Zr, Nb, Mo, Te, Ru, Rh, Pd, Hf, Ta, W, Re, Os, Ir, Pt and/or lanthanides such as, for example, La, Ce, Pr, Nd, Pm, Dy, Yb or Lu, etc. Examples are layers containing, or consisting of, PrTi oxide and $MgF_2$ etc. Furthermore, two or more transparent layers (layers C, D, . . . ) having different refractive indices may be provided to increase the reflectivity as a consequence of partial light reflection at the phase boundary of the layer C and layer D, or further layers.

The individual layers are typically 1 to 200 nm, preferably 1 to 100 nm thick.

Preferred is a layer system containing a layer B and at least one layer C.

The layers may be deposited, for example, by gas- or vapor-phase deposition in vacuo (physical vapor deposition), by thermal evaporation, by electron beam evaporation, with or without ion support, by sputtering, in particular by magnetron sputtering, or by chemical gas-phase deposition (chemical vapor deposition), with or without plasma support, on the surface according to the invention or the previous layer already applied.

The layer or the layer system on the surface according to the invention results, in particular, in articles which have a reflection, measured as reflection value according to DIN 67 530 with Dr. Lange RL 3, of 85 and higher and expediently 90 and higher.

The layer or the layer system can be applied to the surface in a processing sequence which contains the steps of degreasing and cleaning the surface, the loading of the article containing the surface into a vacuum system, cleaning, for example by sputtering, by discharge (glow discharge) etc., possibly the deposition of the adhesive layer (layer A) in the first stage, the deposition of at least one light-reflecting layer, for example metal layer (layer B), in a second stage, the deposition of at least one transparent layer (layer C, possibly layer D and further layers) in a third and possibly a fourth stage and in further stages, and the unloading of the coated article from the vacuum.

The surfaces according to the invention which carry such a layer or such a layer system have an excellent reflection, for example, for electromagnetic radiation and, in particular, electromagnetic radiation in the optical range. The optical range comprises, for example, the infra-red, the range of visible light, the ultraviolet, the X-rays, the $\gamma$-rays etc. A preferred field of application is the range of electromagnetic radiation and, in this connection, of visible light.

Depending on the surface, the reflection of the radiation may be directed, diffuse or a combination thereof, as described above. Consequently, the articles according to the invention of aluminum according to the invention which have a layer or a layer system as described are suitable, for example, as reflectors, such as reflectors, for example, for radiation sources or optical instruments. Such radiation sources are, for example, lighting fixtures or radiant heaters. The reflectors are, for example, mirrors or inside mirrors of optical instruments, lighting fixtures or radiant heaters.

For example, the articles according to the present invention improve the reflection by 5 to 30%, which represents an appreciable potential for energy saving or improvement of light yield. A complete freedom from iridescence (interference effects in the visible wave range) is also achieved.

The articles can be reshaped, in which process a less strongly visible crack formation occurs than is the case in the current prior art with anodised surfaces.

The articles and, in this connection, in particular the surfaces with the layer or the layer system have a good protective effect with respect to chemical, physical or mechanical degradation (for example, corrosion). Particularly effective for this purpose is the layer C or layers C and D and possibly further corresponding layers.

The present invention therefore also comprises the use of articles of aluminum containing at least one surface or parts of at least one surface according to the present invention as substrate for the deposition of a layer or a layer system from the gas phase on said surfaces.

Preferred is the use of articles of aluminum according to the present invention as substrate for the deposition of a reflective layer or a reflective layer system on said surfaces.

Particularly preferred is the use of articles of aluminum according to the present invention as substrate for the deposition of a reflective layer or a reflective layer system for radiations in the optical range such as, for example, heat radiation, visible light, ultraviolet, X-rays or $\gamma$-radiation etc. The reflection of visible light has particular significance.

We claim:

1. Articles of aluminum which comprises at least a part of at least one unanodized surface suitable for the deposition of at least two layers from the gas phase thereon, wherein the unanodized surface has a peak-to-valley height Ra of from 0.3 to 1 microns, and wherein said unanodized surface is selected from the group consisting of (1) refined aluminum with a degree of purity equal to or greater than 98.3% by weight aluminum and (2) aluminum alloys with at least one of the elements from the series Si, Mg, Mn, Cu, Zn, Fe, a ceramic adhesive layer deposited on said unanodized surface, and at least one reflecting layer deposited on said adhesive layer, said layers being deposited from the gas phase for the reflection of radiation with wavelengths in the optical range, said reflecting layer being selected from the group consisting of aluminum, silver, gold, copper and alloys containing at least one of said elements, and wherein said unanodized surface is selected from the group consisting of rolled foil, rolled sheets and rolled strips.

2. Articles according to claim 1 wherein said at least two layers are for the reflection of visible light.

3. Articles according to claim 2 wherein the wavelength of said light is between 400 and 750 nm.

4. Articles according to claim 1 wherein said reflection is selected from the group consisting of directed, diffuse, and mixtures thereof.

5. Articles according to claim 1 wherein the reflection, measured as reflection value according to DIN 67 530 with Dr. Lange RL 3, has a value of at least 85.

6. Articles according to claim 5 wherein said value is at least 90.

7. Articles according to claim 1 including a transparent protective layer over said reflecting layer.

8. Articles according to claim 1 wherein each layer is 1 to 200 nm thick.

9. Articles according to claim 1 wherein the unanodized surface is refined aluminum with a purity of 99.0 and higher.

10. Articles according to claim 1 wherein the unanodized surface is an aluminum alloy containing at least one from 0.25–5% by weight magnesium, 0.1–12% by weight copper, 0.5–5% by weight zinc, 0.5–5% by weight iron, and 0.2–2% by weight manganese.

11. Articles according to claim 1 wherein said adhesive layer contains at least one of (1) compounds of the formula $SiO_x$, where x is a number from 1 to 2, and (2) compounds of the formula $Al_yO_z$ where y/z represent a number from 0.2 to 1.5.

* * * * *